(12) United States Patent
Tracy et al.

(10) Patent No.: US 10,398,050 B2
(45) Date of Patent: Aug. 27, 2019

(54) PLUGGABLE TRANSCEIVER ASSEMBLY AND COMMUNICATION SYSTEM HAVING THE SAME

(71) Applicant: TYCO ELECTRONICS CORPORATION, Berwyn, PA (US)

(72) Inventors: Nathan Lincoln Tracy, Harrisburg, PA (US); Alex Michael Sharf, Harrisburg, PA (US); Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/333,738

(22) Filed: Oct. 25, 2016

(65) Prior Publication Data

US 2018/0116063 A1    Apr. 26, 2018

(51) Int. Cl.
*H05K 7/02* (2006.01)
*H04B 10/40* (2013.01)
*H05K 5/03* (2006.01)
*H05K 7/14* (2006.01)
*H05K 7/20* (2006.01)
*G02B 6/42* (2006.01)

(52) U.S. Cl.
CPC ........... *H05K 7/026* (2013.01); *G02B 6/4284* (2013.01); *H04B 10/40* (2013.01); *H05K 5/03* (2013.01); *H05K 7/02* (2013.01); *H05K 7/1427* (2013.01); *H05K 7/2039* (2013.01)

(58) Field of Classification Search
None
See application file for complete search history.

(56) References Cited

U.S. PATENT DOCUMENTS

| | | | | |
|---|---|---|---|---|
| 5,757,998 A * | 5/1998 | Thatcher | .............. | G02B 6/4201 385/75 |
| 5,980,324 A * | 11/1999 | Berg | ...................... | H01R 13/24 439/630 |
| 6,533,603 B1 * | 3/2003 | Togami | ................ | G02B 6/4246 439/157 |
| 6,986,679 B1 * | 1/2006 | Aronson | ................ | H01R 25/00 439/170 |
| 8,885,342 B2 * | 11/2014 | Skepnek | ............... | H01L 23/367 174/548 |
| 9,474,188 B2 * | 10/2016 | Moore | ................... | H05K 3/301 |
| 2003/0076658 A1 * | 4/2003 | Aronson | .............. | G02B 6/4201 361/741 |

(Continued)

*Primary Examiner* — Courtney Smith (57) ABSTRACT

Pluggable transceiver assembly includes a transceiver body having first and second plug portions and a common base portion that joins the first and second plug portions. The first and second plug portions are separated from each other by an elongated wall-receiving gap that is sized and shaped to receive a receptacle wall of a receptacle assembly. The pluggable transceiver assembly also includes a communication sub-assembly having a transceiver substrate that includes first and second plug sections and a shared section that joins the first and second plug sections. The first and second plug sections extend toward a leading end of the transceiver body from the shared section to substrate edges of the first and second plug sections, respectively. The substrate edges include electrical contacts configured to engage a corresponding receptacle connector of the receptacle assembly.

19 Claims, 5 Drawing Sheets

(56) References Cited

U.S. PATENT DOCUMENTS

| | | | |
|---|---|---|---|
| 2004/0246693 A1* | 12/2004 | Lloyd | H01R 13/65802 361/800 |
| 2006/0211302 A1* | 9/2006 | Daly | H01R 23/6873 439/540.1 |
| 2012/0099275 A1* | 4/2012 | Regnier | H05K 7/20709 361/690 |
| 2012/0168122 A1* | 7/2012 | Skepnek | H01L 23/367 165/80.2 |
| 2013/0217256 A1* | 8/2013 | Dudemaine | H01R 13/46 439/352 |
| 2016/0211625 A1* | 7/2016 | Sharf | H01R 12/721 |

* cited by examiner

PLUGGABLE TRANSCEIVER ASSEMBLY AND COMMUNICATION SYSTEM HAVING THE SAME

BACKGROUND

The subject matter herein relates generally to pluggable transceiver assemblies and communication systems that include pluggable transceiver assemblies.

Communication systems exist today that utilize plug and receptacle assemblies to transmit data. For example, network systems, servers, data centers, and the like may use plug and receptacle assemblies to interconnect the various devices of the communication system. A plug and receptacle assembly includes a cable assembly having a pluggable transceiver (or electrical connector) and a receptacle assembly. The receptacle assembly is designed to receive the pluggable transceiver and communicatively couple to the pluggable transceiver. The receptacle assembly is also designed to absorb thermal energy away from the pluggable transceiver and, for example, permit the thermal energy to dissipate into the surrounding region.

The pluggable transceiver includes signal pathways and ground pathways in which the signal pathways convey data signals and the ground pathways control impedance and reduce crosstalk between the signal pathways. The pluggable transceivers may be configured to transfer electrical signals in accordance with industry standards. By way of example, known industry standards for pluggable transceivers include small-form factor pluggable (SFP), enhanced SFP (SFP+), quad SFP (QSFP), C form-factor pluggable (CFP), and 10 Gigabit SFP, which is often referred to as XFP. The pluggable transceivers may be capable of implementing one or more communication protocols. Non-limiting examples of communication protocols that may be implemented by pluggable transceivers include Ethernet, Fibre Channel, InfiniBand, and Synchronous Optical Networking (SONET)/Synchronous Digital Hierarchy (SDH). The pluggable transceiver may be a direct attach copper (DAC), an active optical cable (AOC), or an optical transceiver (Txcvr).

Among other things, industry standards require that a pluggable transceiver have a predetermined physical configuration that is partially based on the number of lanes or channels supported by the pluggable transceiver. For example, the QSFP standard is designed to support four bi-directional lanes. If a greater number of lanes were desired, it would not only be necessary for the configuration of the pluggable transceiver to be changed, but also the configuration of the receptacle assembly. This would require physical design changes (e.g., changes to size and shape) and electrical design changes (e.g. changes in data processing and/or transmission) to the receptacle assembly. Design changes to industry standards can be costly and have limited applications.

Accordingly, there is a need for an alternative pluggable transceiver that increases the number of communication lanes while minimizing the design changes to the receptacle assembly.

BRIEF DESCRIPTION

In an embodiment, a pluggable transceiver assembly is provided that includes a transceiver body having first and second plug portions and a common base portion that joins the first and second plug portions. The first and second plug portions have respective mating ends that form a leading end of the transceiver body. The common base portion has a loading end of the transceiver body that is configured to engage a communication cable. The first and second plug portions are separated from each other by an elongated wall-receiving gap that is sized and shaped to receive a receptacle wall of a receptacle assembly. The pluggable transceiver assembly also includes a communication sub-assembly having a transceiver substrate that includes first and second plug sections and a shared section that joins the first and second plug sections. The shared section is positioned within the common base portion of the transceiver body. The first and second plug sections are positioned within the first and second plug portions, respectively, of the transceiver body. The first and second plug sections extend toward the leading end of the transceiver body from the shared section to substrate edges of the first and second plug sections, respectively. The substrate edges include electrical contacts configured to engage a corresponding receptacle connector of the receptacle assembly.

In some embodiments, the communication sub-assembly may include a plurality of signal pathways that extend through the shared section and the first plug section and also plurality of signal pathways that extend through the shared section and the second plug section. The signal pathways that extend through the first and second plug sections may be communicatively coupled to a common processing unit that modifies data signals. The signal pathways that extend through the first and second plug sections may be communicatively coupled to the communication cable. Optionally, the common processing unit is mounted to the shared section. Optionally, the plug portions are physically configured in accordance with a known small-form factor standard.

In some embodiments, the shared section has a logic-based device mounted thereto that is configured to communicate with a host device for managing the data signals transmitted through the first and second plug portions as a group. Optionally, the logic-based device may also be capable of communicating with the host device to manage the first and second plug portions individually, like separate pluggable transceivers.

In some embodiments, the transceiver body includes first and second housing shells that engage each other along a housing seam. Optionally, the first housing shell is a body shell that receives the transceiver substrate, and the second housing shell is a transceiver cover that encloses the transceiver substrate within the body shell. Optionally, the transceiver cover includes an external thermal-transfer element.

In an embodiment, a communication system is provided that includes a host circuit board and a receptacle assembly mounted to the host circuit board. The receptacle assembly including first and second communication ports separated by a receptacle wall. Each of the first and second communication ports has a passage and a receptacle connector that is disposed in the passage. The communication system also includes a pluggable transceiver assembly configured to mate with the receptacle assembly during a mating operation. The pluggable transceiver assembly includes a transceiver body having first and second plug portions and a common base portion that joins the first and second plug portions. The first and second plug portions have respective mating ends that form a leading end of the transceiver body. The common base portion has a loading end of the transceiver body that is configured to engage a communication cable. The first and second plug portions are separated from each other by an elongated wall-receiving gap that is sized and shaped to receive the receptacle wall of the receptacle assembly when the first and second plug portions are inserted into the first and second communication ports, respectively, during the mating operation. The pluggable transceiver assembly also includes a communication sub-assembly having a transceiver substrate that includes first and second plug sections and a shared section that joins the first and second plug sections. The shared section is positioned within the common base portion of the transceiver body. The first and second plug sections are positioned within the first and second plug portions, respectively, of the transceiver body. The first and second plug sections extend toward the leading end of the transceiver body from the shared section to substrate edges of the first and second plug sections, respectively. The substrate edges include electrical contacts configured to engage one of the corresponding receptacle connectors of the receptacle assembly.

DETAILED DESCRIPTION

Embodiments set forth herein include pluggable transceiver assemblies and communication systems that include the same. The pluggable transceiver assemblies include a transceiver body having multiple plug portions and common base portion that joins the plug portions. Each plug portion may be physically configured to be effectively identical to an industry standard for a pluggable transceiver. For example, the pluggable transceivers and corresponding receptacle assemblies may be physically configured (e.g., sized and shaped) to satisfy industry standards for small-form factor pluggable (SFP), enhanced SFP (SFP+), quad SFP (QSFP), a microQSFP, C form-factor pluggable (CFP), and 10 Gigabit SFP, which is often referred to as XFP, or other small-form factor standards.

The pluggable transceivers and corresponding receptacle assemblies may be capable of implementing one or more communication protocols including, but not necessarily limited to, Ethernet, Fibre Channel, InfiniBand, and Synchronous Optical Networking (SONET)/Synchronous Digital Hierarchy (SDH). The pluggable transceiver is configured to engage a communication cable and may be a direct attach copper (DAC) transceiver, an active optical cable (AOC) transceiver, or an optical transceiver (Txcvr).

Each of the plug portions of the pluggable transceiver assembly is configured to be inserted into a respective port of the receptacle assembly and mate with a respective connector. The receptacle assembly may be mounted to a printed circuit board (e.g., host board) having other communication components mounted thereto, such as an integrated circuit, that communicate with the connectors of the receptacle assembly.

Embodiments may create a single device that interfaces across multiple ports of the receptacle assembly while managing the data transmission through the multiple ports as a single port. Thus, a single cable assembly (e.g., one pluggable transceiver and corresponding communication cable(s)) may replace multiple cable assemblies. By way of example, a known port may be configured to communicate through four lanes (or channels) at 25 gigabits/second (Gbps) for a total of 100 Gbps. The pluggable transceiver assemblies set forth herein may communicate through eight lanes at 25 Gbps for a total of 200 Gbps. Although the pluggable transceiver assembly may occupy multiple communication ports, the multiple communication ports may be managed as a single port by the communication system. In particular embodiments, the communication system may be backwards compatible such that the communication system is capable of managing each port individually and also capable of managing multiple ports as a single port.

Figure 1:
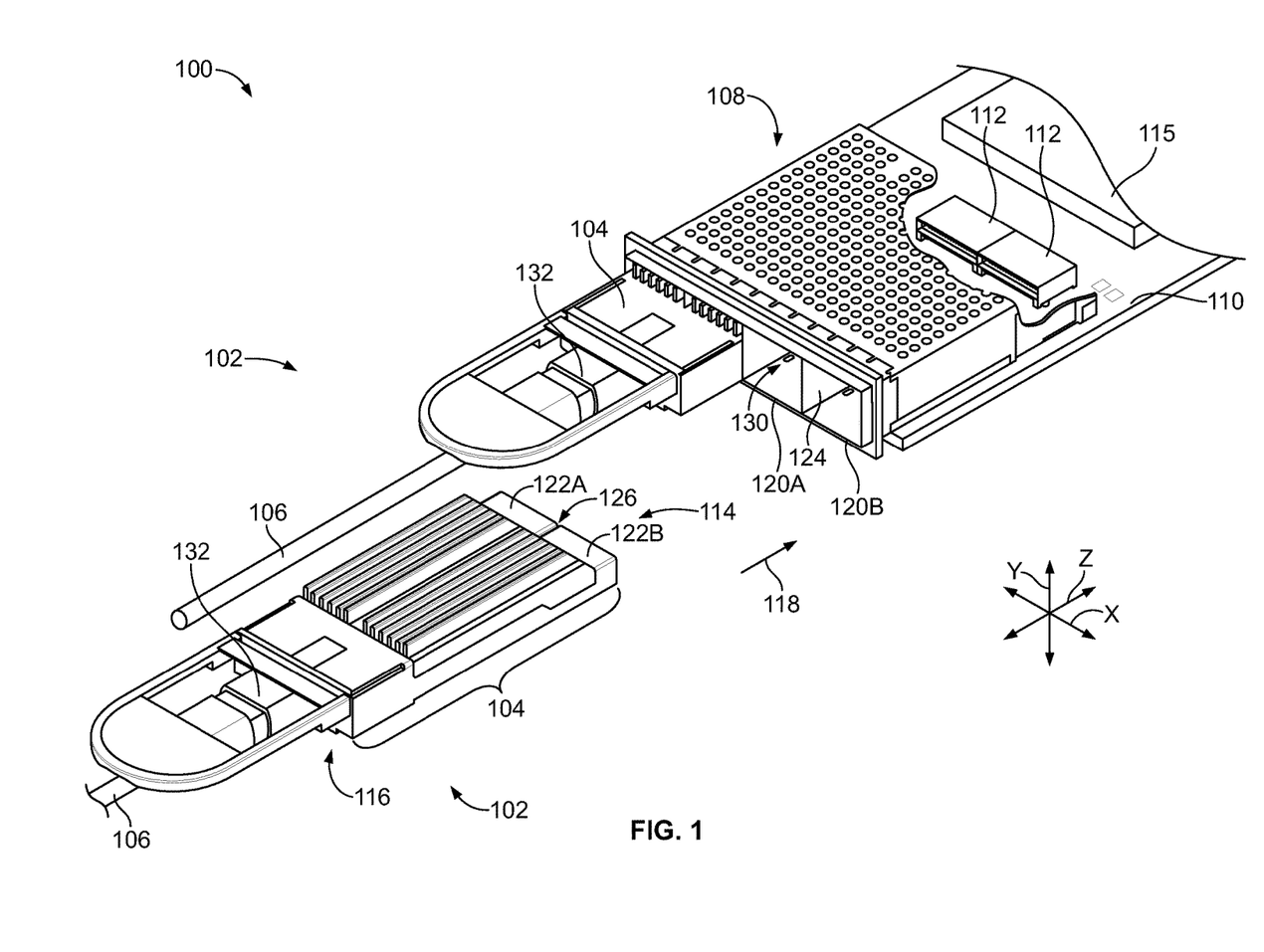
FIG. 1 is a front perspective view of a portion of a communication system in accordance with an embodiment that includes a pluggable transceiver assembly and a receptacle assembly.

FIG. 1 is a front perspective view of a portion of a communication system 100 in accordance with an embodiment. As shown, the communication system 100 includes multiple cable assemblies 102 in which each of the cable assemblies 102 has a pluggable transceiver assembly 104 and a communication cable 106. The communication system 100 also includes a receptacle assembly 108 that is mounted to a host circuit board 110 (e.g., host board). The communication system 100 may also include host devices 115 (e.g., integrated circuits, processors, and the like) that are mounted to the host circuit board 110 and in electrical communication with receptacle connectors 112 of the receptacle assembly 108. For example, the host device 115 in FIG. 1 is an application specific integrated circuit (ASIC) that is configured to communicate with each of the receptacle connectors 112. The ASIC may constitute a serializer/deserializer (SerDes) interface. The receptacle assembly 108 is configured to interface with the pluggable transceiver assembly 104. For reference, the communication system 100 is oriented with respect to X, Y, and Z axes.

The pluggable transceiver assembly 104 has a leading end 114 and a trailing or loading end 116. The leading end 114 leads the pluggable transceiver assembly 104 during a mating operation in which the pluggable transceiver assembly 104 is moved along a mating direction 118 that is parallel to the Z axis. As shown, the pluggable transceiver assembly 104 includes first and second plug portions 122A, 122B. In FIG. 1, the pluggable transceiver assembly 104 includes two plug portions 122A, 122B, but it is contemplated that the pluggable transceiver assembly 104 may include more than two plug portions (e.g., three or four) in other embodiments. As shown, the first and second plug portions 122A, 122B are adjacent to each other and are separated from each other by an elongated wall-receiving gap or slot 126.

The receptacle assembly 108 includes first and second communication ports 120A, 120B separated by a receptacle wall 124. Each of the communication ports 120A, 120B includes a receiving passage 130 and a respective receptacle connector 112 that is disposed within the respective receiving passage 130. Each receptacle connector 112 is configured to engage a corresponding plug portion of the pluggable transceiver assembly 104. The receptacle connectors 112 may be edge connectors. During a mating operation in which the communication ports 120A, 120B receive the first and second plug portions 122A, 122B, respectively, the receptacle wall 124 moves into and through the wall-receiving gap 126.

In the illustrated embodiment, the communication cable 106 is a single optical fiber cable that communicates optical signals. The communication cable 106 includes a cable connector 132 that engages the trailing end 116 of the pluggable transceiver assembly 104. For example, the pluggable transceiver assembly 104 may include a cavity or socket that is sized and shaped to pluggably engage the cable connector 132. In other embodiments, the communication cable 106 may include one or more electrical cables (e.g., copper cables) that communicate electrical signals. The electrical cables may include wires (not shown) that are mechanically and electrically coupled (e.g., soldered) to the pluggable transceiver assembly 104. Although each cable assembly 102 is shown as having only a single pluggable transceiver assembly 104 in FIG. 1, it should be understood that the cable assembly 102 may include another pluggable transceiver assembly coupled to an opposite end of the communication cable 106.

Figure 2:
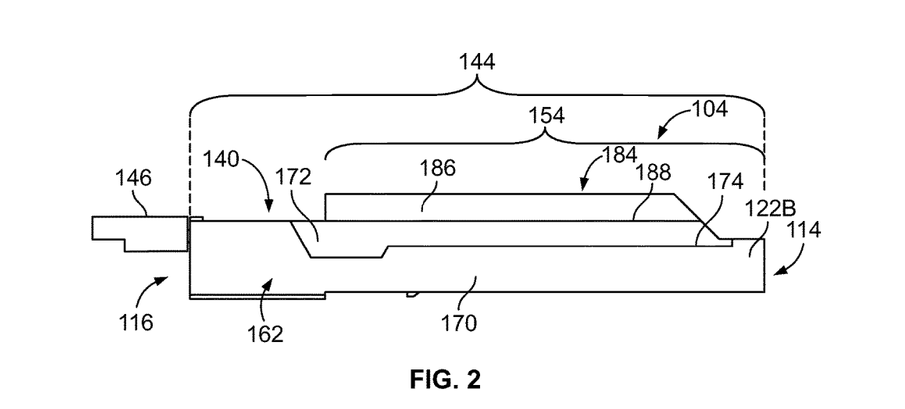
FIG. 2 is a side view of the pluggable transceiver assembly that may be used with the communication system of FIG. 1.
Figure 3:
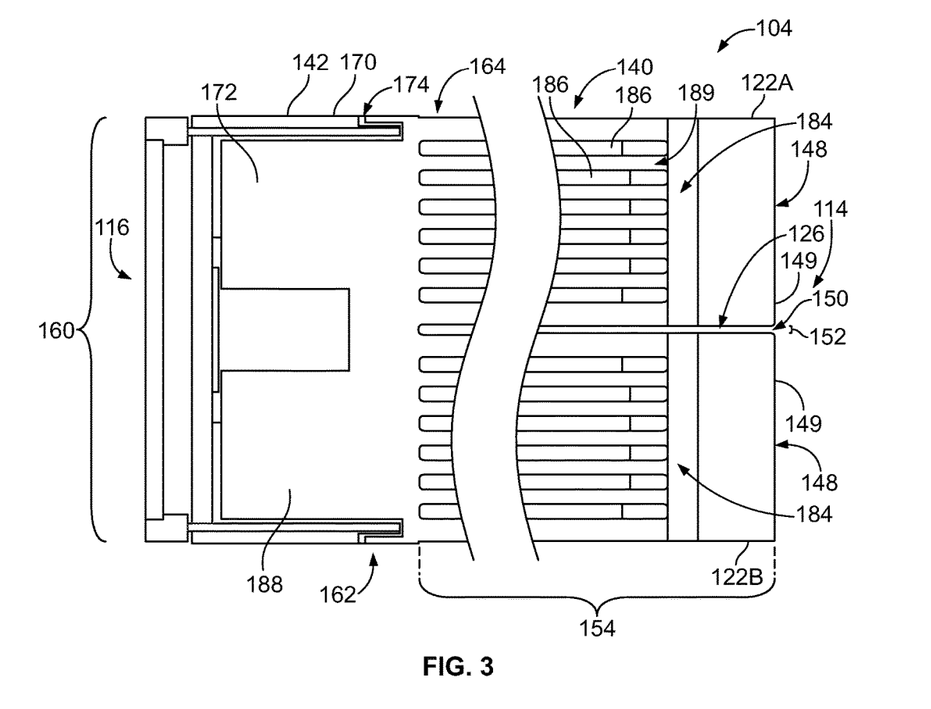
FIG. 3 is a top-down view of the pluggable transceiver assembly that may be used with the communication system of FIG. 1.

FIG. 2 is a side view of the pluggable transceiver assembly 104, and FIG. 3 is a top-down view of the pluggable transceiver assembly 104 with a mid-portion of the pluggable transceiver assembly 104 removed for illustrative purposes. The pluggable transceiver assembly 104 has a transceiver body or housing 140 that includes the first plug portion 122A (FIG. 3) and the second plug portion 122B. The transceiver body 140 also includes a common base portion 142 that joins the first and second plug portions 122A, 122B. The transceiver body 140 has a body length 144 (FIG. 2) that extends between the trailing end 116 and the leading end 114. The transceiver body 140 may have a body width 160 (FIG. 3) that extends between a longitudinal side 162 and a longitudinal side 164 (FIG. 3) of the transceiver body 140. By way of example only, the body length 144 may be at least 50 mm or at least 60 mm. The body width 160 may be at least 20 mm or at least 30 mm.

The pluggable transceiver assembly 104 also includes a pull tab 146 that is coupled to a locking mechanism (not shown). When the pull tab 146 is pulled, the locking mechanism releases the pluggable transceiver assembly 104 from the receptacle assembly 108 (FIG. 1).

Each of the first and second plug portions 122A, 122B has a respective mating end 148. The mating ends 148 may be defined by an edge 149 of the respective plug portion of the transceiver body 140. The edges 149 define openings 202 (shown in FIG. 4) to respective plug cavities 204 (shown in FIG. 4). As shown in FIG. 3, a slot opening 150 to the wall-receiving gap 126 is defined between the mating ends 148 of the first and second plug portions 122A, 122B. The slot opening 150 and the wall-receiving gap 126 may have a maximum width 152 that is, for example, at most three millimeters or at most two millimeters. The wall-receiving gap 126 has a gap length 154 (also shown in FIG. 2). The gap length 154 may extend along a majority of the body length 144. For example, the gap length 154 may be at least 65% the body length 144 or, more particularly, at least 75% the body length 144.

The mating ends 148 and the slot opening 150 collectively form the leading end 114 of the pluggable transceiver assembly 104 or the transceiver body 140. The common base portion 142 includes the trailing end 116 of the pluggable transceiver assembly 104 or the transceiver body 140. Each of the first and second plug portions 122A, 122B may be configured to be similar to a known pluggable transceiver module standard. For example, the mating end 148 and at least a majority of the respective plug portion may be similar to a microQSFP module. In other embodiments, however, the mating end 148 and at least a majority of the respective plug portion may be similar to an SFP module, SFP+ module, QSFP module, CFP module, or XFP module. In some embodiments, the entire plug portion is dimensioned similar or identical to a known pluggable transceiver module standard.

Figure 4:
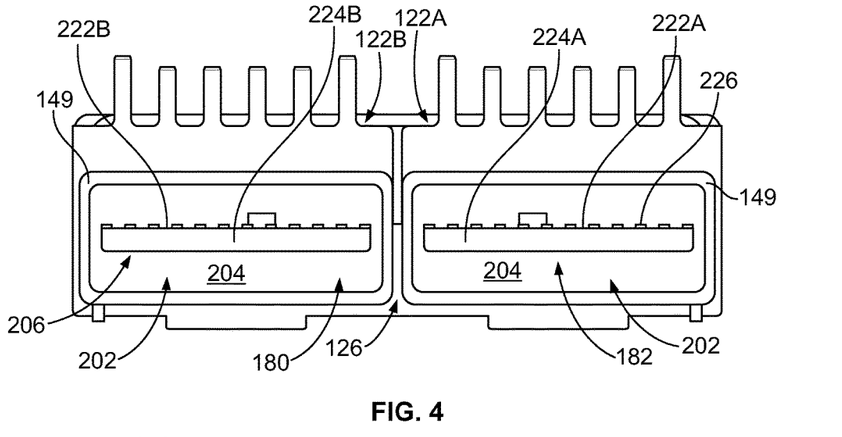
FIG. 4 is a front end view of the pluggable transceiver assembly that may be used with the communication system of FIG. 1.
Figure 5:
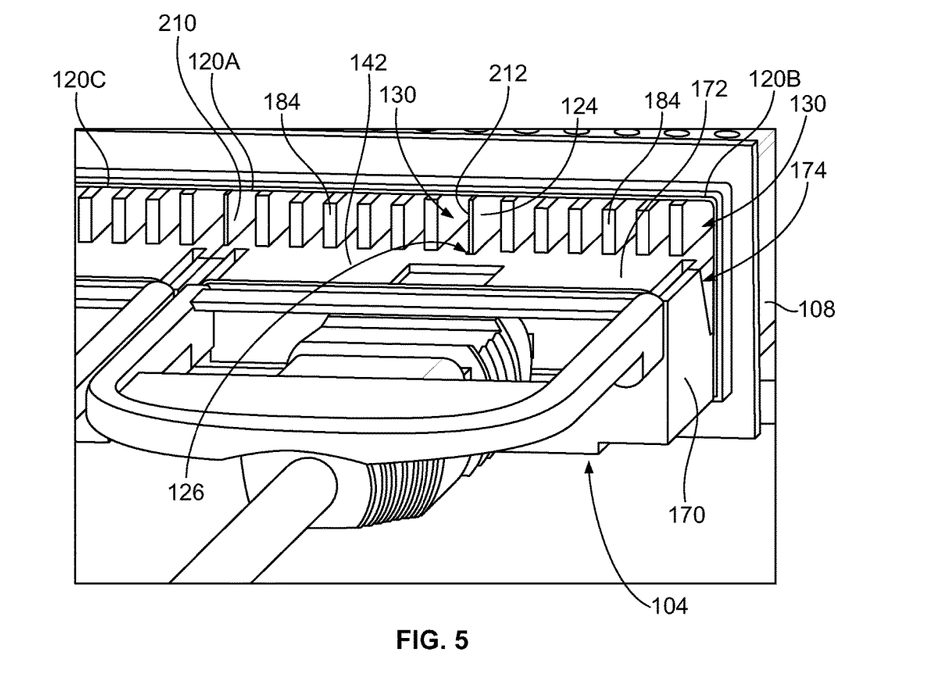
FIG. 5 is an enlarged rear perspective view of the pluggable transceiver assembly that may be used with the communication system of FIG. 1.

As shown in FIGS. 2 and 3, the transceiver body 140 may be formed by first and second housing shells 170, 172. The first and second housing shells 170, 172 may engage each other along a housing seam 174. The first and second housing shells 170, 172 and the housing seam 174 are also shown in FIG. 5. With respect to FIGS. 2 and 3, the first housing shell 170 defines a majority of an interior space 180 (shown in FIG. 4) of the transceiver body 140 and the second housing shell 172 encloses the interior space 180. As such, the first housing shell 170 may be referred to as a body shell, and the second housing shell 172 may be referred to as a transceiver cover. The interior space 180 is sized and shaped to hold a communication sub-assembly 182 (shown in FIG. 4) of the pluggable transceiver assembly 104.

The second housing shell 172 includes a top side 188 of the transceiver body 140. In the illustrated embodiment, the second housing shell 172 also includes an external thermal-transfer element 184. The thermal-transfer element 184 includes a series of thermal-transfer plates or fins 186 that are separated by thermal-transfer slots 189 (FIG. 3). In some embodiments, the second housing shell 172 is a unitary piece that includes the top side 188 of the transceiver body 140 and the thermal-transfer element 184. The top side 188 encloses the interior space 180 (FIG. 4). However, it should be understood that the thermal-transfer element 184 is optional and that alternative embodiments may not include a thermal-transfer element. In such embodiments, the receptacle assembly 108 (FIG. 1) may include one or more heat sinks.

FIG. 4 is a front end view of the pluggable transceiver assembly 104. As shown, the edges 149 of the first and second plug portions 122A, 122B define the openings 202 to respective plug cavities 204. The plug cavities 204 of the first and second plug portions 122A, 122B form a portion of the interior space 180. The interior space 180 also includes a base cavity 203 (shown in FIG. 6).

Each of the plug cavities 204 has a portion of the communication sub-assembly 182 disposed therein. More specifically, the communication sub-assembly 182 includes a transceiver substrate 206 having first and second plug sections 222A, 222B. The transceiver substrate 206 may be, for example, a circuit board having conductive elements (e.g., conductive traces, vias, and pads) that form signal and ground pathways therethrough. The first and second plug sections 222A, 222B may be portions of the circuit board and include substrate edges 224A, 224B, respectively. Each of the substrate edges 224A, 224B has a plurality of electrical contacts 226 (e.g., contact pads) therealong that are configured to engage the corresponding receptacle connector 112 (FIG. 1) of the receptacle assembly 108 (FIG. 1).

FIG. 5 is an enlarged rear perspective view of the pluggable transceiver assembly 104 in a mated or engaged position with the receptacle assembly 108. As shown, the communication ports 120A, 120B are separated by the receptacle wall 124. Another communication port 120C may be separated from the communication port 120A by another receptacle wall 210. As shown in FIG. 5, the first and second plug portions 122A, 122B have been inserted into the corresponding receiving passages 130 of the communication ports 120A, 120B and the receptacle wall 124 is positioned within the wall-receiving gap 126. The thermal-transfer elements 184 are disposed within the receiving passages 130. The common base portion 142, however, is positioned outside of the receptacle assembly 108 in an exterior of the receptacle assembly 108.

As shown, the receptacle wall 124 includes a wall edge 212 that partially defines openings to the passages 130. In some embodiments, the wall edge 212 may operate as a positive stop. More specifically, the wall edge 212 may engage the common base portion 142 so that the electrical contacts 226 (FIG. 4) and substrate edges 224A, 224B (FIG. 4) do not move beyond a designated location within the passages 130.

Figure 6:
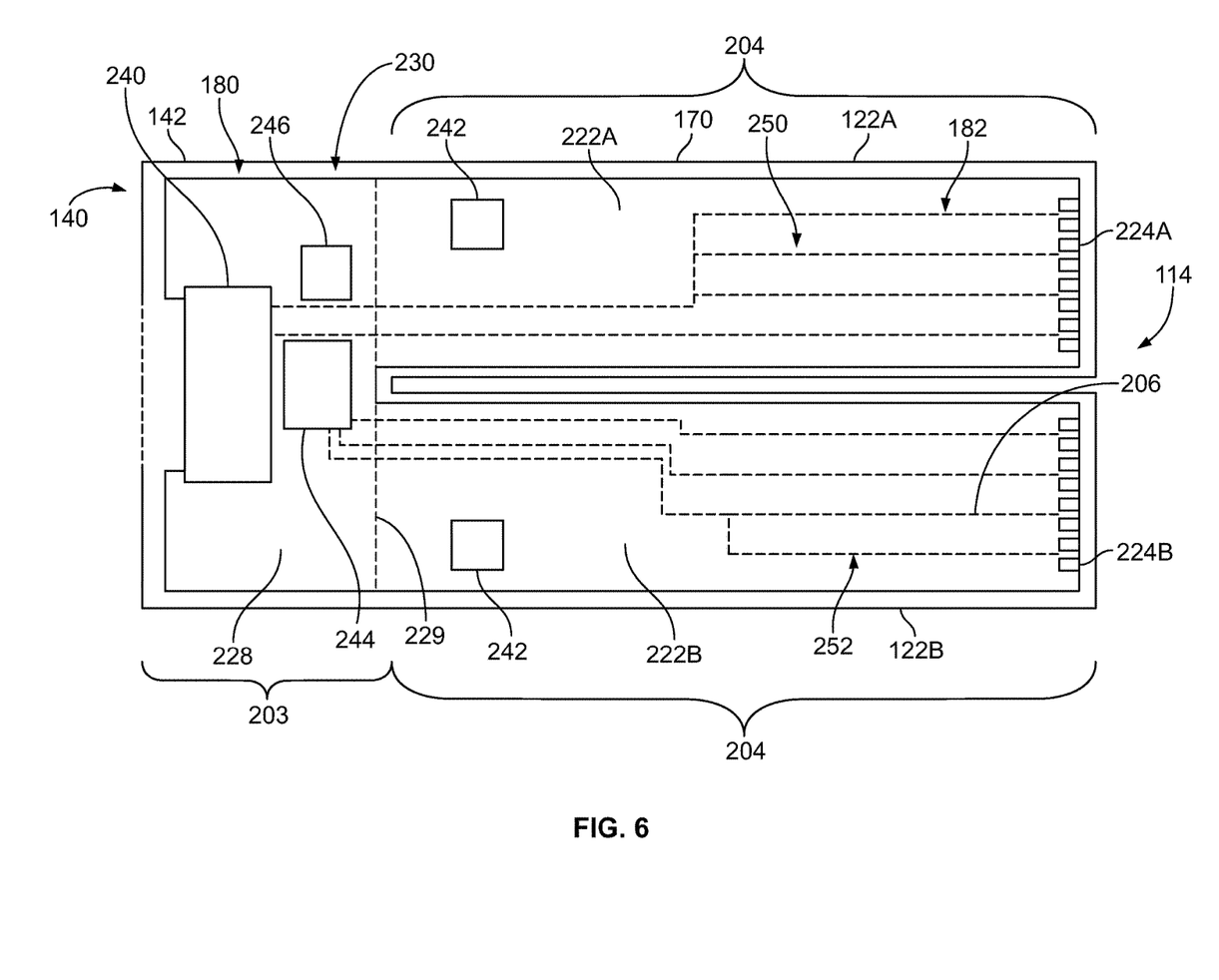
FIG. 6 is a plan view of a communication sub-assembly that may be used with the pluggable transceiver assembly of FIG. 1.

FIG. 6 is a plan view of a communication sub-assembly 182 disposed within the first housing shell 170. For illustrative purposes, the second housing shell 172 (FIG. 2) has been removed. The first housing shell 170 forms a basin 230 that may define different regions of the interior space 180. More specifically, the interior space 180 includes a base cavity 203 and two plug cavities 204. The base cavity 203 is an interior region of the common base portion 142, and the plug cavities 204 are interior regions of the plug portions 122A, 122B. The interior space 180 is entirely defined when the second housing shell 172 is coupled to the first housing shell 170.

The transceiver substrate 206 includes the first and second plug sections 222A, 222B and a shared section 228 that joins the first and second plug sections 222A, 222B. A line 229 in FIG. 6 represents the division of the shared section 228 and the first and second plug sections 222A, 222B. The shared section 228 is positioned within the common base portion 142 or, more specifically, the base cavity 203 of the common base portion 142. The first and second plug sections 222A, 222B are positioned within the first and second plug portions 122A, 122B or, more specifically, within the corresponding plug cavities 204 of the first and second plug portions 122A, 122B. The first and second plug sections 222A, 222B extend toward the leading end 114 of the transceiver body 140 from the shared section 228 to the substrate edges 224A, 224B of the first and second plug sections 222A, 222B, respectively.

The communication sub-assembly 182 may also include a module connector 240 that is configured to engage an end of the communication cable 106 (FIG. 1). For example, the module connector 240 is configured to mate with the cable connector 132 (FIG. 1). If the communication cable 106 includes optical fibers, the module connector 240 may be a signal converter that converts optical data signals to electrical data signals and vice versa. If the communication cable 106 includes insulated wires (e.g., copper wires), the module connector 240 may be a ferrule that surrounds and grips an end of the communication cable 106. The communication cable 106 may include terminating ends of the insulated wires that are stripped to expose wire conductors that are then terminated (e.g., soldered) to conductive pads of the transceiver substrate 206.

The communication sub-assembly 182 may also include one or more processing units 242, 244 that are configured to modify data signals that are transmitted through the pluggable transceiver assembly 104 (FIG. 1). The processing units 242, 244 may be, for example, one or more converters (e.g., multiplexer, demultiplexer), transimpedance amplifiers (TIAs), laser drivers, logic-based devices, resistors, capacitors, etc. In the illustrated embodiment, the processing unit 244 is a common processing unit that is mounted to the shared section 228, and the processing units 242 are local processing units that are mounted to respective plug sections 222A, 222B.

The common processing unit 244 is configured to receive data signals from the communication cable 106 and/or provide data signals to the communication cable 106. The common processing unit 244 may be communicatively coupled to conductive pathways that extend through the first plug section 222A and conductive pathways that extend through the second plug section 222B. For example, the common processing unit 244 may be communicatively coupled to the local processing units 242.

The communication sub-assembly 182 may also include memory 246 that is configured to store instructions and/or data regarding operation of the pluggable transceiver assembly 104. The memory 246 may communicate with the common processing unit 244. The memory 246 may include volatile and/or non-volatile memory. For example, the memory 246 may include electrically erasable programmable read-only memory (EEPROM). Although the memory 246 is illustrated as a single element, it should be understood that the memory 246 may be a plurality of separate memory elements.

The memory 246 may have at least one memory map that is similar to memory maps of known pluggable transceivers. A memory map may describe capabilities, standard interfaces, manufacturer, and other information of the pluggable transceiver assembly 104. For example, the memory map may include a block that is directly available and used for diagnostics and control functions that are accessed repeatedly. Another block of the memory map may be used for less frequently accessed functions and/or control space for future standards.

The at least one memory map of the pluggable transceiver assembly 104 may enable the pluggable transceiver assembly 104 to communicate with the host device 115 (FIG. 1) in one or more designated manners. For example, the pluggable transceiver assembly 104 may communicate with the host device 115 as multiple separate transceivers (e.g., two separate transceivers) or communicate with the host device 115 as a lesser number of transceivers (e.g., only a single transceiver). One memory map may enable the communication system to manage each port as a separate port. For example, the data rate of each port may be 100 Gps. In other words, the pluggable transceiver assembly 104 may function as two separate 100 Gbps transceivers. However, another memory map may enable the communication system to manage multiple ports (e.g., two ports) as a single port. The data rate for the combined ports may be 200 Gbps. In other words, the pluggable transceiver assembly 104 may function as a single 200 Gbps transceiver. Accordingly, the pluggable transceiver assembly 104 may operate as individual transceivers (e.g., equal to the number of plug sections) or as a lesser number of transceivers (e.g., as a single transceiver). To this end, the pluggable transceiver assembly 104 may communicate with the host device 115 (e.g., through a "handshake") to instruct the host device how to communicate with and manage the pluggable transceiver assembly 104.

The common processing unit 244 may be configured to manage (or facilitate managing) the data signals that are transmitted through the first and second plug sections 222A, 222B as a group. For example, the first plug section 222A may include four lanes or channels that are capable of operating at 25 gigabits/second (Gbps) for a total of 100 Gbps. It should be understood that the data rates may be greater or lesser than 25 Gbps in other embodiments. Likewise, the second plug section 222B may include four lanes that are capable of operating at, for example, 25 gigabits/second (Gbps) for a total of 100 Gbps. The common processing unit 244 may cooperate with the host system to manage the data signals that are transmitted through the first and second plug sections 222A, 222B as a group. As such, the pluggable transceiver assembly 104 may operate as a transceiver assembly that is capable of transmitting 200 Gbps.

Accordingly, the communication sub-assembly 182 may include a plurality of signal pathways 250 (indicated by multiple dashed lines) that extend through the shared section 228 and through the first plug section 222A. The communication sub-assembly 182 may also include a plurality of signal pathways 252 that extend through the shared section 228 and through the second plug section 222B. The signal pathways 250, 252 are communicatively coupled to the common processing unit 244 and to the communication cable 106 (FIG. 1). In some embodiments, at least one of the plug sections may be configured to operate in short reach applications (e.g., SR4 or less than 150 meters) and/or at least one of the plug sections may be configured to operate in a long reach application (e.g., LR4 or two kilometers or more).

Figure 7:
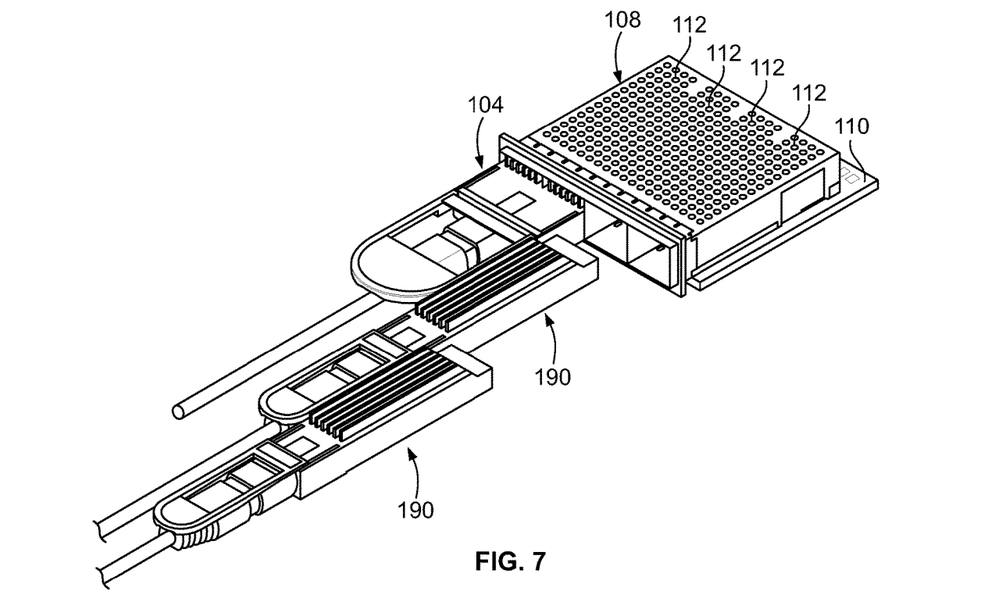
FIG. 7 illustrates the receptacle assembly of FIG. 1 engaging pluggable transceiver assemblies having a single plug portion.

FIG. 7 illustrates the receptacle assembly 108 mated with one of the pluggable transceiver assemblies 104, and two pluggable transceiver assemblies 190 poised to mate with the receptacle assembly 108. In some embodiments, the receptacle assembly 108 and the host circuit board 110 (and other components) are backwards-compatible such that the receptacle connectors 112 may communicate with either the pluggable transceiver assemblies 104 or the pluggable transceiver assemblies 190. The pluggable transceiver assemblies 190 may be physically and electrically configured in accordance with a known small-form factor standard (e.g., microQSFP).

Figure 8:
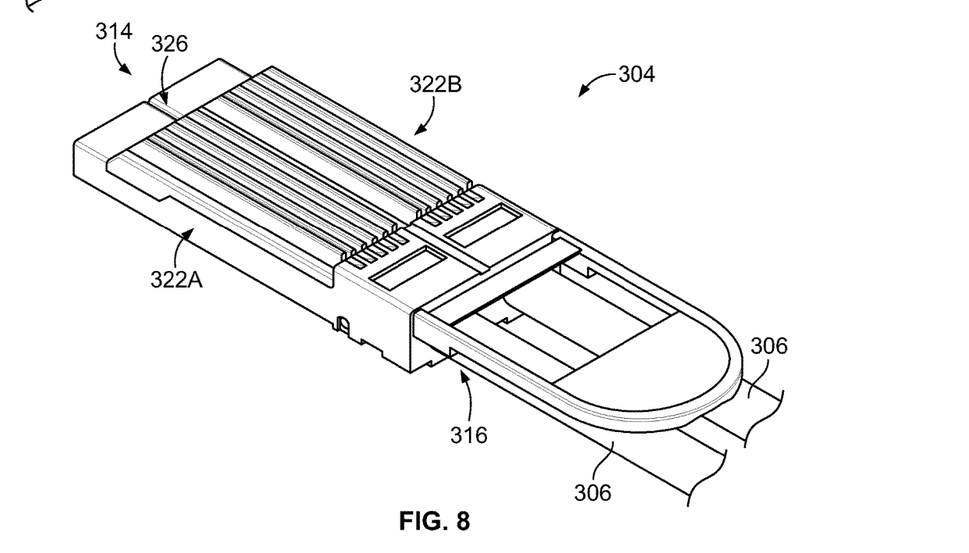
FIG. 8 is a perspective view of a pluggable transceiver assembly in accordance with an embodiment.

FIG. 8 is a perspective view of a pluggable transceiver assembly 304 in accordance with an embodiment. The pluggable transceiver assembly 304 may be similar to the pluggable transceiver assembly 104 (FIG. 1). For example, the pluggable transceiver assembly 304 has a leading end 314 and a trailing end 316. The pluggable transceiver assembly 304 also includes first and second plug portions 322A, 322B. The first and second plug portions 322A, 322B are adjacent to each other and are separated from each other by an elongated wall-receiving gap 326.

Unlike the pluggable transceiver assembly 104 (FIG. 1), the pluggable transceiver assembly 304 is communicatively coupled to two communication cables 306. The communication cables 306 are coupled to the trailing end 316. The communication cables 306 may be electrical cables that include respective bundles (not shown) of insulated wires. In some embodiments, the pluggable transceiver assembly 304 may be characterized as a direct attach copper (DAC) pluggable transceiver assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A pluggable transceiver assembly comprising:
a transceiver body having first and second plug portions and a common base portion that joins the first and second plug portions, the first and second plug portions having respective mating ends that form a leading end of the transceiver body, the common base portion having a loading end of the transceiver body that is configured to engage a communication cable, wherein the first and second plug portions are separated from each other by an elongated wall-receiving gap that is sized and shaped to receive a receptacle wall of a receptacle assembly; and
a communication sub-assembly comprising a transceiver substrate that includes first and second plug sections and a shared section that joins the first and second plug sections, the shared section being positioned within the common base portion of the transceiver body, the first and second plug sections being positioned within the first and second plug portions, respectively, of the transceiver body, the first and second plug sections extending toward the leading end of the transceiver body from the shared section to substrate edges of the first and second plug sections, respectively, the substrate edges including electrical contacts configured to engage corresponding receptacle connectors of the receptacle assembly;
wherein the communication sub-assembly includes a plurality of signal pathways that extend through the shared section and the first plug section and a plurality of signal pathways that extend through the shared section and the second plug section, each of the first and second plug sections operable to communicate at a respective data rate; and
wherein the pluggable transceiver assembly further comprises a processing unit that is operable to manage data signals through the signal pathways of the first and second plug sections as a group such that the pluggable transceiver assembly functions as a single transceiver having a data rate that is greater than either of the respective data rates of the first and second plug sections.

2. The pluggable transceiver assembly of claim 1, wherein the communication sub-assembly includes a plurality of signal pathways that extend through the shared section and the first plug section and a plurality of signal pathways that extend through the shared section and the second plug section, wherein the signal pathways that extend through the first and second plug sections are communicatively coupled to a common processing unit that modifies data signals.

3. The pluggable transceiver assembly of claim 2, wherein the common processing unit is mounted to the shared section.

4. The pluggable transceiver assembly of claim 1, wherein the plug portions are physically configured in accordance with a known small-form factor standard.

5. The pluggable transceiver assembly of claim 1, wherein the shared section has a logic-based device mounted thereto that is configured to communicate with a host device for managing the data signals transmitted through the first and second plug portions as a group.

6. The pluggable transceiver assembly of claim 1, wherein the transceiver body includes first and second housing shells that engage each other along a housing seam, each of the first and second housing shells forming a portion of the first plug section and a portion of the second plug section.

7. The pluggable transceiver assembly of claim 6, wherein the first housing shell is a body shell that receives the transceiver substrate and the second housing shell is a transceiver cover that encloses the transceiver substrate within the body shell.

8. The pluggable transceiver assembly of claim 7, wherein the transceiver cover includes an external thermal-transfer element, wherein the transceiver cover is a unitary piece that forms the thermal-transfer element such that the thermal-transfer element is an integrated part of the pluggable transceiver assembly.

9. The pluggable transceiver assembly of claim 1, wherein the data rate of the pluggable transceiver assembly functioning as the single transceiver is operable to be equal to a sum of the respective data rates of the first and second plug sections.

10. A communication system comprising:
a host circuit board having a host device mounted thereto;
a receptacle assembly mounted to the host circuit board and including first and second communication ports separated by a receptacle wall, each of the first and second communication ports having a respective passage and a respective receptacle connector that is disposed in the respective passage; and
a pluggable transceiver assembly configured to mate with the receptacle assembly during a mating operation, the pluggable transceiver assembly comprising:
a transceiver body having first and second plug portions and a common base portion that joins the first and second plug portions, the first and second plug portions having respective mating ends that form a leading end of the transceiver body, the common base portion having a loading end of the transceiver body that is configured to engage a communication cable, wherein the first and second plug portions are separated from each other by an elongated wall-receiving gap that is sized and shaped to receive the receptacle wall of the receptacle assembly when the first and second plug portions are inserted into the first and second communication ports, respectively, during the mating operation; and
a communication sub-assembly comprising a transceiver substrate that includes first and second plug sections and a shared section that joins the first and second plug sections, the shared section being positioned within the common base portion of the transceiver body, the first and second plug sections being positioned within the first and second plug portions, respectively, of the transceiver body, the first and second plug sections extending toward the leading end of the transceiver body from the shared section to substrate edges of the first and second plug sections, respectively, the substrate edges including electrical contacts configured to engage one of the corresponding receptacle connectors of the receptacle assembly;
wherein the communication sub-assembly includes a plurality of signal pathways that extend through the shared section and the first plug section and a plurality of signal pathways that extend through the shared section and the second plug section, each of the first and second plug sections operable to communicate at a respective data rate;
wherein the pluggable transceiver assembly and the host device are operable to manage data signals through the signal pathways of the first and second plug sections as a group such that the first and second communication ports function as a single port having a data rate that is greater than either of the respective data rates of the first and second plug sections.

11. The communication system of claim 10, wherein the common base portion defines an end of the wall-receiving gap, the wall-receiving gap and the receptacle wall being dimensioned relative to each other such that the receptacle wall engages the common base portion to complete the mating operation.

12. The communication system of claim 10, wherein the communication sub-assembly includes a plurality of signal pathways that extend through the shared section and the first plug section and a plurality of signal pathways that extend through the shared section and the second plug section, wherein the signal pathways that extend through the first and second plug sections are communicatively coupled to a common processing unit of the pluggable transceiver assembly that modifies data signals.

13. The communication system of claim 10, wherein the plug portions are physically configured in accordance with a known small-form factor standard.

14. The communication system of claim 10, wherein a logic-based device is mounted to the shared section, the logic-based device being configured to communicate with a host device for managing the data signals transmitted through the first and second plug portions as a group.

15. The communication system of claim 10, wherein the transceiver body includes first and second housing shells that engage each other along a housing seam.

16. The communication system of claim 15, wherein the first housing shell is a body shell that receives the transceiver substrate and the second housing shell is a transceiver cover that encloses the transceiver substrate within the body shell.

17. The communication system of claim 16, wherein the transceiver cover includes an external thermal-transfer element, wherein the transceiver cover is a unitary piece that forms the thermal-transfer element such that the thermal-transfer element is an integrated part of the pluggable transceiver assembly.

18. The pluggable transceiver assembly of claim 1, wherein the transceiver body includes first and second housing shells that engage each other along a housing seam, each of the first and second housing shells forming a portion of the first plug section and a portion of the second plug section, the second housing shell including an external thermal-transfer element that extends along the first plug section and the second plug section, the second housing shell being a unitary piece that forms the thermal-transfer element such that the thermal-transfer element is an integrated part of the pluggable transceiver assembly.

19. The communication system of claim 10, wherein the data rate of the pluggable transceiver assembly functioning as the single transceiver is operable to be equal to a sum of the respective data rates of the first and second plug sections.

* * * * *